United States Patent
Tsukamoto et al.

(10) Patent No.: US 8,288,748 B2
(45) Date of Patent: Oct. 16, 2012

(54) INFORMATION RECORDING AND REPRODUCING DEVICE

(75) Inventors: Takayuki Tsukamoto, Kawasaki (JP); Chikayoshi Kamata, Kawasaki (JP); Takeshi Yamaguchi, Kawasaki (JP); Takahiro Hirai, Yokohama (JP); Shinya Aoki, Yokohama (JP); Kohichi Kubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 12/889,558

(22) Filed: Sep. 24, 2010

(65) Prior Publication Data

US 2011/0062405 A1 Mar. 17, 2011

Related U.S. Application Data

(63) Continuation of application No. PCT/JP2008/057365, filed on Apr. 15, 2008.

(51) Int. Cl.
*H01L 29/02* (2006.01)

(52) U.S. Cl. ............. 257/2; 257/3; 257/4; 257/E45.001; 257/E21.004; 438/102; 365/165

(58) Field of Classification Search .................. 257/2–5, 257/E29.001, E45.001, E21.004; 438/438, 438/382, 102, 103; 365/165
See application file for complete search history.

(56) References Cited

U.S. PATENT DOCUMENTS

| | | | | |
|---|---|---|---|---|
| 4,757,492 A | * | 7/1988 | Fukushima et al. | 369/100 |
| 4,969,141 A | * | 11/1990 | Takaoka et al. | 369/100 |
| 5,420,845 A | * | 5/1995 | Maeda et al. | 369/100 |
| 5,889,756 A | * | 3/1999 | Ichihara et al. | 369/275.2 |
| 7,733,684 B2 | | 6/2010 | Kubo et al. | |
| 2006/0228531 A1 | * | 10/2006 | Iwasa et al. | 428/195.1 |
| 2010/0202187 A1 | | 8/2010 | Kubo et al. | |
| 2011/0024713 A1 | * | 2/2011 | Kamata et al. | 257/2 |

FOREIGN PATENT DOCUMENTS

| | | |
|---|---|---|
| JP | 2004-234707 | 8/2004 |
| JP | 2006-80259 | 3/2006 |
| JP | 2007-533118 | 11/2007 |
| JP | 2008-503425 | 2/2008 |
| JP | 2008-84512 | 4/2008 |

OTHER PUBLICATIONS

International Preliminary Report on Patentability and Written Opinion of the International Searching Authority issued Dec. 9, 2010, in Patent Application No. PCT/JP2008/057365.
U.S. Appl. No. 12/879,424, filed Sep. 10, 2010, Yasutake.

* cited by examiner

*Primary Examiner* — Telly Green
(74) *Attorney, Agent, or Firm* — Oblon, Spivak, McClelland, Maier & Neustadt, L.L.P.

(57) ABSTRACT

According to one embodiment, an information recording and reproducing device includes a first layer, a second layer, and a recording layer between the first and second layers, which is capable of a transition between a first state of a low resistance and a second state of a high resistance by flowing a current between the first and second layers. A peripheral portion of the recording layer has a composition different from that of a center portion of the recording layer. The center portion includes two kinds of cation elements. And the center portion is different from the peripheral portion in a ratio of the two kinds of cation elements.

22 Claims, 15 Drawing Sheets

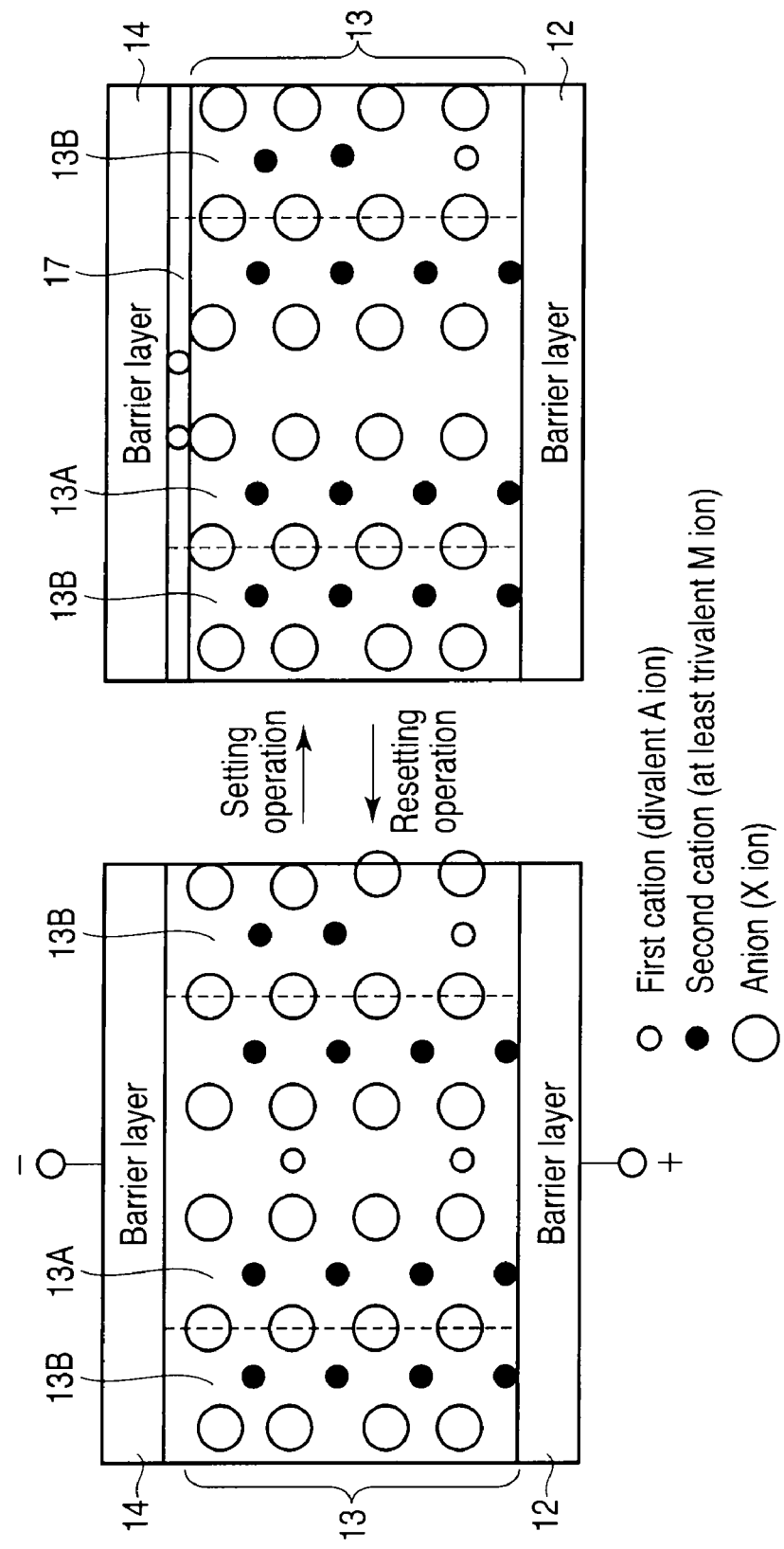
F I G. 5

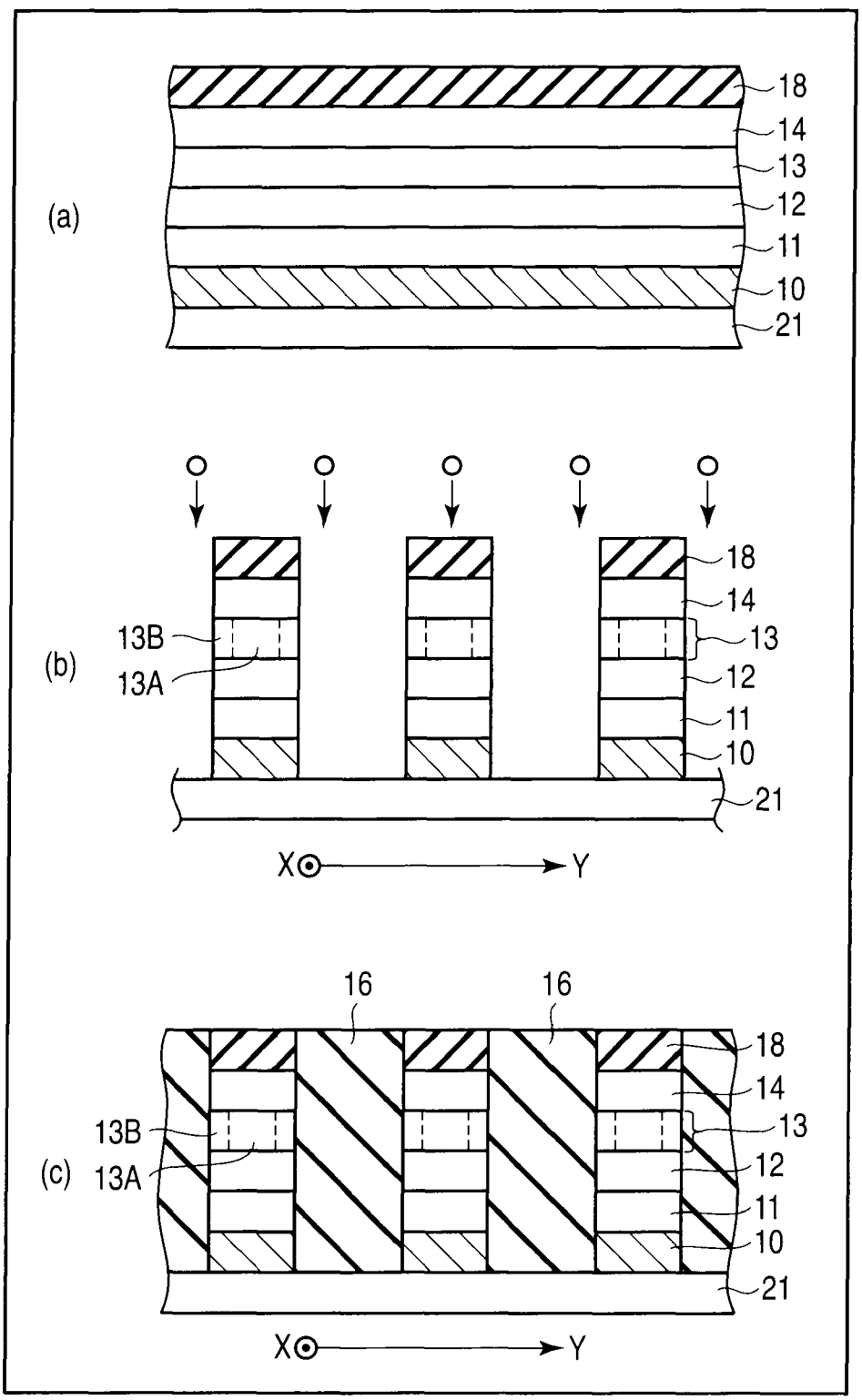
F I G. 9

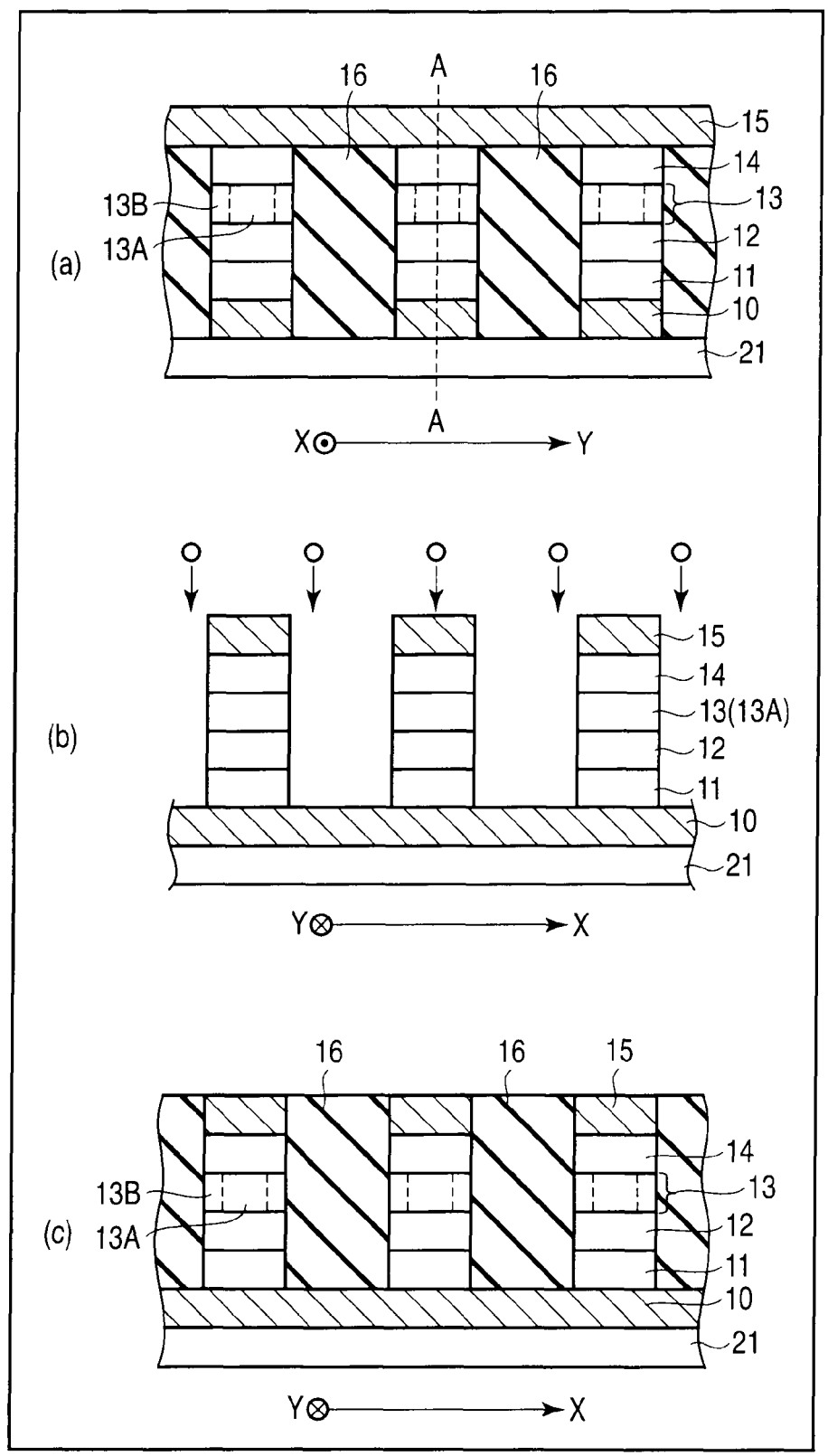
F I G. 10

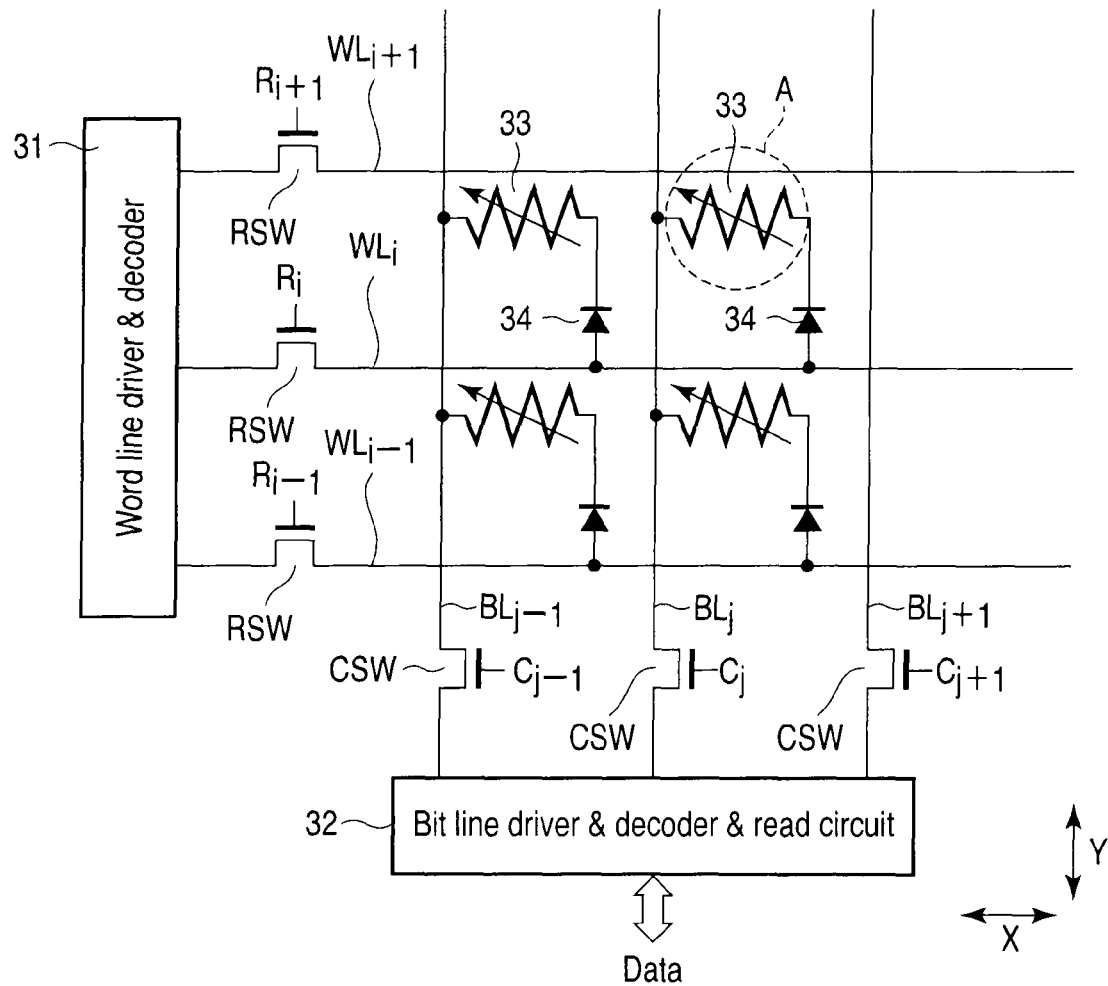
F I G. 12

INFORMATION RECORDING AND REPRODUCING DEVICE

CROSS-REFERENCE TO RELATED APPLICATION

This is a Continuation Application of PCT Application No. PCT/JP2008/057365, filed Apr. 15, 2008, which was published under PCT Article 21(2) in Japanese.

FIELD

The present invention relates to a nonvolatile semiconductor random storage device having a large capacity.

BACKGROUND

Recently compact mobile devices have been widespread worldwide and, at the same time, a demand of a compact, large-capacity nonvolatile memory is rapidly increasing with the significant progress of the high-speed data transfer network. Among others, in a NAND flash memory and a compact hard disk drive (HDD), recording density is rapidly enhanced to create a large market.

On the other hand, some ideas of novel memories have been proposed in order to considerably exceed a limit of the recording density.

For example, a phase-change memory (PRAM) adopts a principle, in which a material that can take two states, that is, an amorphous state (OFF) and a crystalline state (ON) is used as a recording material and data is recorded while the two states are correlated with binary data "0" and "1".

As to write/erase, for example, the amorphous state is created by applying a large-power pulse to the recording material and the crystalline state is created by applying a small-power pulse to the recording material.

As to read, a small read current is passed through the recording material to an extent that the write/erase does not occur and the electrical resistance of the recording material is measured to read the data. The electrical resistance of the recording material in the amorphous state is larger than that of the recording material in the crystalline state, and the difference in electrical resistance is about $10^3$.

There is also reported a novel memory that has an operating principle very similar to that of the PRAM although the memory is different from the PRAM (For example, see Jpn. Pat. Appln. KOKAI Publication No. 2004-234707).

According to this report, nickel oxide is a typical example of the recording material in which the data is recorded, and the large-power pulse and the small-power pulse are used in the write/erase similarly to the PRAM. In this case, power consumption is advantageously reduced during the write/erase compared with the PRAM.

Although an operating mechanism of this novel memory is not found out up to the present date, reproducibility is confirmed, and the memory is regarded as one of potential candidates for the one with high recording density. Some groups try to find out the operating mechanism of the memory.

BRIEF SUMMARY

One example of the present invention provides an information recording and reproducing device having high repetitive stability.

According to one example of the invention, an information recording and reproducing device includes a first layer, a second layer, and a recording layer between the first and second layers, which is capable of a transition between a first state of a low resistance and a second state of a high resistance by flowing a current between the first and second layers. A peripheral portion of the recording layer has a composition different from that of a center portion of the recording layer. The center portion includes two kinds of cation elements. And the center portion is different from the peripheral portion in a ratio of the two kinds of cation elements.

According to one example of the invention, an information recording and reproducing device having high repetitive stability can be provided.

BRIEF DESCRIPTION OF DRAWINGS

FIGS. 2 to 7 are views, each illustrating an example of a section of a recording layer.

FIGS. 9 and 10 are views, each illustrating one step of the method of manufacturing the recording layer.

FIG. 12 is a view illustrating a semiconductor memory.

DETAILED DESCRIPTION

An exemplary embodiment of the invention will be described below with reference to the drawings.

1. Structure

1-1 First Example

Figure 1:
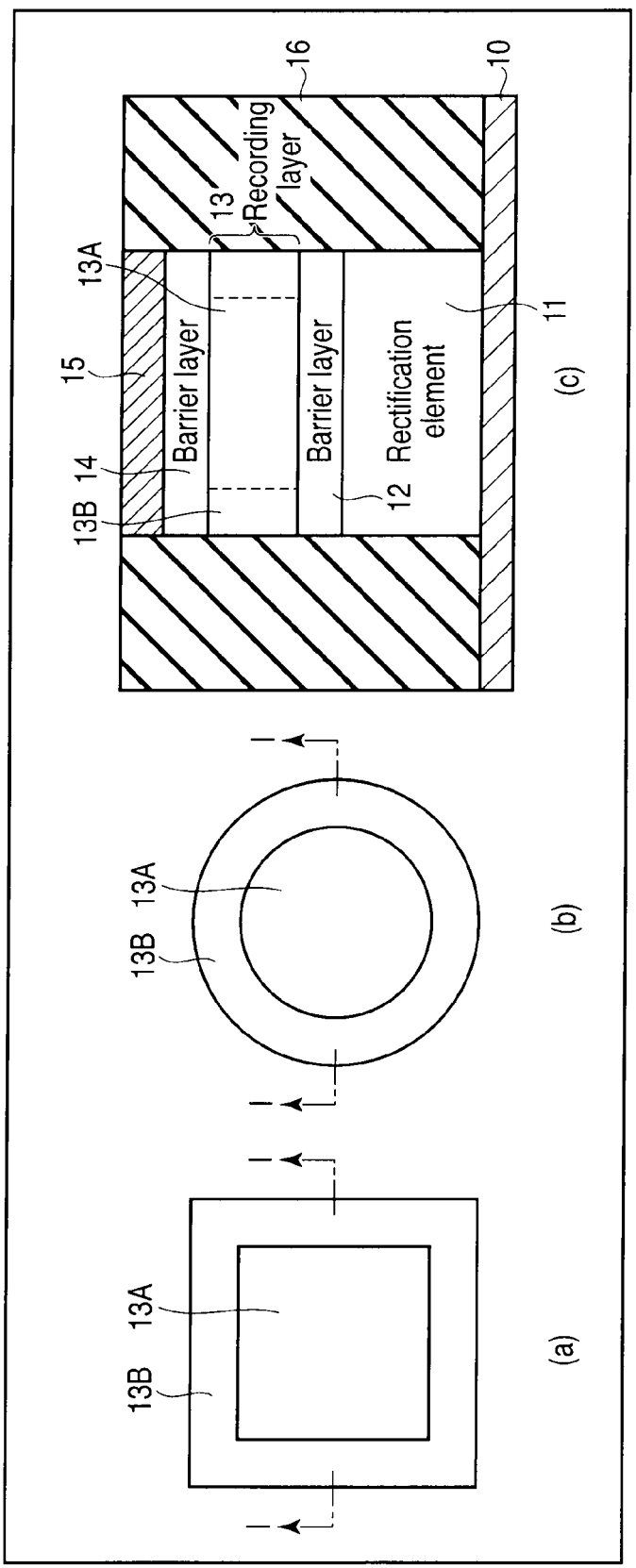
FIG. 1 is a view illustrating an information recording and reproducing device.

FIG. 1 illustrates an example of a structure of a memory cell included in an information recording and reproducing device according to the invention. FIGS. 1A and 1B illustrate examples of planar shapes of the memory cell, and FIG. 1C illustrates an example of a section taken along line I-I of FIGS. 1A and 1B.

The numeral 10 designates a bit line, the numeral 11 designates a rectification element, the numeral 12 designates a first barrier layer, the numeral 13 designates a recording layer, the numeral 14 designates a second barrier layer, and the numeral 15 designates a word line. The memory cells are separated from each other by an insulating material 16. The recording layer 13 includes a center portion 13A and a peripheral portion 13B. The first and second barrier layers 12 and 14 may be an electrode layer. Hereinafter the electrode layer means one that is provided above and below the recording layer 13 to provide an electrical connection to the recording layer 13, for example, a barrier layer or a conductive layer that acts as the barrier layer.

The rectification element 11 having a rectification property is provided in order to provide an orientation of a polarity of a potential difference between the bit line 10 and the word line 15. The first barrier layer 12 and the second barrier layer 14 are provided above and below the recording layer 13 to provide the electrical connection to the recording layer 13. The first barrier layer 12 and the second barrier layer 14 may also act as the barrier layer that prevents the element diffusion between the recording layer 13 and constituents above and below the recording layer 13.

For example, a Zener diode, a PN junction diode, a schottky diode, and a metal-insulator-metal (MIM) element can be used as the rectification element 11. In the rectification element 11, desirably the resistance in an unselected state (off) is ten times or more than the resistance in a selected state (on).

In the memory cell illustrated in FIG. 1, the center portion 13A of the recording layer 13 is a composite compound including at least two kinds of cation elements, at least one of the cation elements is a transition element having a d orbital that is incompletely filled with electrons, and the center portion 13A may be made of a first compound whose shortest distance between the adjacent cation elements is 0.32 nm or less. When the compound has a spinel structure, an ilmenite structure, a wolframite structure, or a delafossite structure, preferably the change in resistance is easily generated by the application of the voltage.

As described later, the peripheral portion 13B of the recording layer 13 is a region where the amount of one kind of cation elements decreases compared to the center portion 13A of the recording layer 13.

Figure 2:
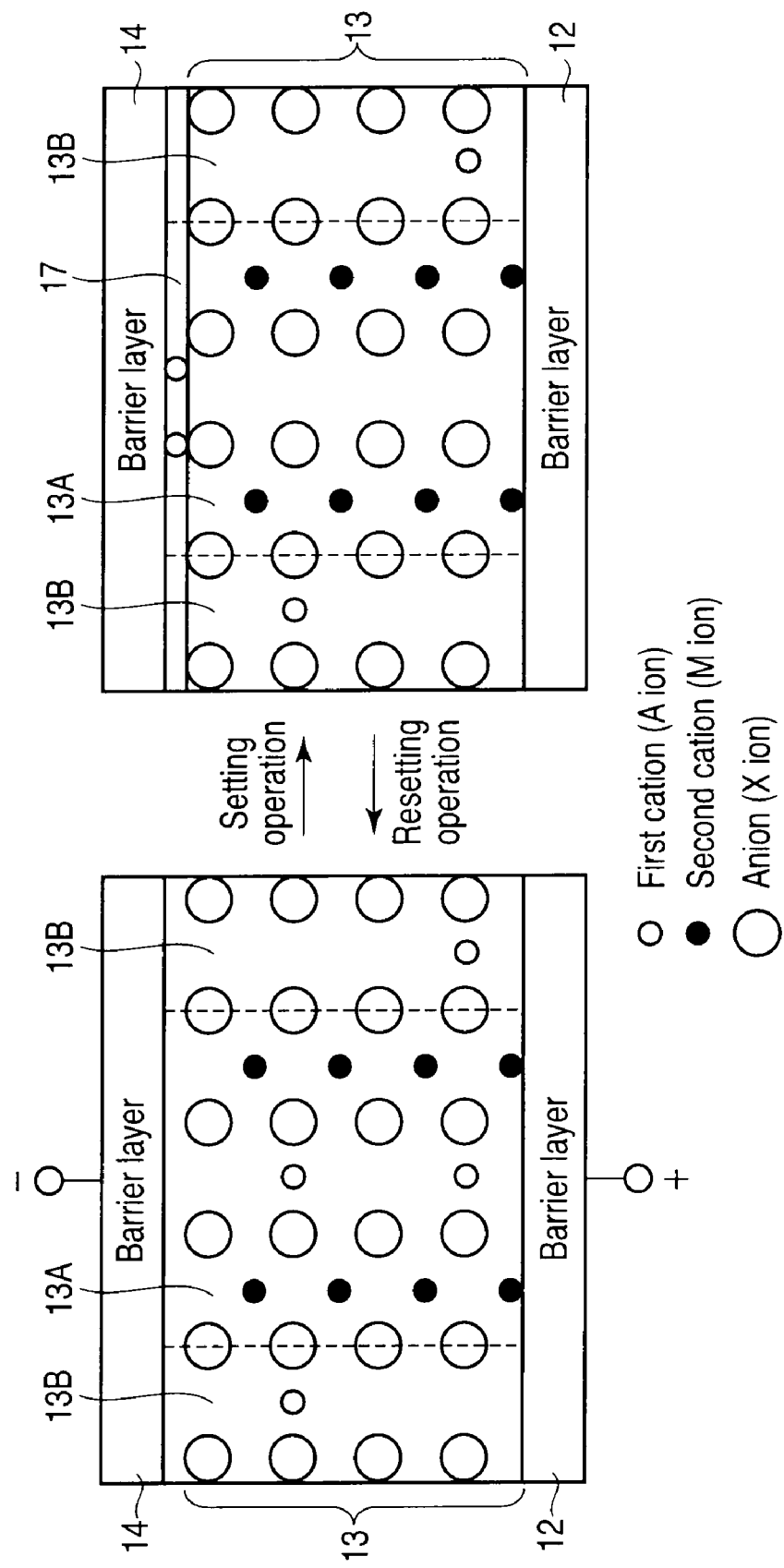

A principle of the change in resistance in the center portion 13A of the recording layer 13 having the spinel structure, the ilmenite structure, the wolframite structure, or the delafossite structure will be described with reference to FIG. 2. The recording layer 13 will be described in detail. A small white circle in the recording layer 13 indicates a first cation, and a large white circle indicates an anion (oxygen ion). A small black circle indicates a second cation.

Some first cations move in the crystal when a voltage is applied to the recording layer 13 to generate a potential gradient in the recording layer 13. In the example of the invention, the initial state of the recording layer 13 is set to an insulator (high-resistance state), the phase change of the recording layer 13 is generated by the potential gradient to provide conductivity (low-resistance state) to the recording layer 13, thereby performing the recording. The recording will be described with reference to FIG. 2.

For example, the state in which a potential at the second barrier layer 14 is relatively lower than a potential at the first barrier layer 12 is created. A negative potential only needs to be provided to the word line 15 when the bit line 10 is set to a fixed potential (for example, ground potential).

At this point, some first cations in the center portion 13A of the recording layer 13 move onto the side of the second barrier layer 14 (cathode), and the number of first cations in the center portion (crystal) 13A of the recording layer 13 decreases relative to the number of anions. The first cations that move onto the side of the second barrier layer 14 receive electrons from the second barrier layer 14 to be precipitated in the form of metal, thereby forming a metallic layer 17.

In the recording layer 13, the anions become excessive to raise the valences of the transition element ions (first cations or second cations) in the recording layer 13. That is, because the recording layer 13 has electron conductivity by the carrier injection, the recording (setting operation) is completed.

As to the reproduction, a current pulse is passed through the recording layer 13 to detect the resistance of the recording layer 13, thereby easily reproducing the data. However, it is necessary to pass the current pulse to an extent that the change in resistance is not generated in the material of the recording layer 13.

The above-described procedure is a kind of electrolysis, and it can be considered that an oxidation agent is generated by electrochemical oxidation on the side of the first barrier layer (anode) 12 while a reductant agent is generated by electrochemical reduction on the side of the second barrier layer 14.

Therefore, in order to return a recording state (low-resistance state) to an initial state (high-resistance state), for example, it is necessary that the recording layer 13 be subjected to Joule heating by a large current pulse to promote a redox reaction of the recording layer 13. That is, the recording layer 13 returns to the insulator by residual heat after the large current pulse is cut off (resetting operation).

The resetting operation can also be performed by applying an electric field opposite to the setting operation. That is, when the bit line 10 is set to the fixed potential similarly to the setting operation, a positive potential may be provided to the word line 15. In addition to the redox reaction by the Joule heat, the metallic layer near the second barrier layer 14 is oxidized to become the first cation, and the first cation returns to the base structure by the potential gradient in the recording layer 13. Therefore, in the transition element ion whose valence is raised, because the valence of the transition element ion decreases to the value identical to that before the setting, the recording layer 13 returns to the insulator (the initial state). In order to apply the opposite electric field, for example, Zener breakdown is used when the pn junction diode is used.

However, in order to put the operating principle to practical use, it is necessary to confirm that the resetting operation is not generated at room temperature (securement of a sufficiently long retention time) and that the power consumption of the resetting operation is sufficiently small.

For the former, the sufficiently long retention time can be secured by setting the valence of the first cation to at least divalence.

Assuming that the first cation is univalent like a Li ion, the ion movement resistance is insufficiently obtained in the setting state, and the first cation element returns instantaneously from the metallic layer 17 to the center portion 13A of the recording layer 13. In other words, the sufficiently long retention time is not obtained.

When the first cation is trivalent, possibly crystal collapse is generated in the worst case because the voltage necessary for the setting operation increases.

Accordingly, preferably the valence of the first cation is set divalent in the information recording and reproducing device.

For the latter, use of a structure in which a first cation radius is optimized to make a movement path such that the diffusion ion can move in the recording layer (crystal) 13 without generating crystal destruction can reduce the power consumption of the resetting operation. The later-described elements and crystal structure may be used as the recording layer 13.

Alternatively, in the case where the cation having a coordination number of two like the delafossite structure is used as the first cation, when the valence of the first cation is set to +1 to reduce a Coulomb repulsion force, the first cation diffuses easily, and the state can stably be retained after the diffusion.

As described above, in order to easily generate the diffusion of the first cation by the application of the voltage, preferably a layer of the first cation element is disposed in a direction in which the electrodes are connected. Therefore, preferably a c-axis is disposed in parallel with the recording layer 13 in the spinel structure, the ilmenite structure, and the delafossite structure, and preferably an a-axis is disposed in parallel with the recording layer 13 in the wolframite structure.

The following materials can be cited as the first compound in which the change in resistance is easily generated with the low power consumption.

For example, the first compound has a spinel structure expressed by $A_xM_yX_4$ ($0.1 \leq x \leq 2.2$ and $1.5 \leq y \leq 2$). A and M are elements that are different from each other, and at least one of A and M is a transition element having a d orbital that is incompletely filled with electrons. X is an element including at least an element selected from the group comprising of oxygen (O) and nitrogen (N).

A is at least one element selected from the group comprising of Na, K, Rb, Be, Mg, Ca, Sr, Ba, Al, Ga, Mn, Fe, Co, Ni, Cu, Zn, S, P, Se, Ge, Ag, Au, Cd, Sn, Sb, Pt, Pd, Hg, Tl, Pb, and Bi.

Preferably A is at least one element selected from the group comprising of Mg, Mn, Fe, Co, Ni, Zn, Cd, and Hg. This is because the use of the elements optimizes the ion radius in order to maintain the crystal structure while the ion mobility can sufficiently be secured. The valence of the ion is easily controlled to divalence.

More preferably A is at least one element selected from the group comprising of Zn, Cd, and Hg. This is because the use of the elements facilitates the generation of the cation movement. M is at least one element selected from the group comprising of Al, Ga, Ti, Ge, Sn, V, Cr, Mn, Fe, Co, Ni, Nb, Ta, Mo, W, Re, Ru, and Rh.

Preferably M is at least one element selected from the group comprising of Ti, Zr, Hf, V, Nb, Ta, Cr, Mo, W, Mn, Re, Fe, Co, Ni, Al, and Ga. This is because the use of the elements easily controls the electron state in the crystal.

More preferably M is at least a transition element selected from the group comprising of Cr, Mo, W, Mn, and Re (for the sake of convenience, referred to as "group 1"). This is because the use of the elements stably retains the base structure to be able to stably repeat the switching.

Preferably M further includes at least one kind of element selected from the group comprising of Fe, Co, Ni, Al, and Ga in addition to the transition element of the group 1. When the element is used instead of the element of the group 1, the base structure is stably retained to be able to stably repeat the switching.

Further, for example, the first compound has the delafossite structure expressed by $A_xM_yX_2$ ($0.1 \leq x \leq 1.1$ and $0.9 \leq y \leq 1.1$). A and M are elements that are different from each other, and at least one of A and M is a transition element having the d orbital that is incompletely filled with electrons. X is an element including at least one element selected from the group comprising of oxygen (O) and nitrogen (N).

A is at least one element selected from the group comprising of Li, Na, Be, Mg, Ca, Cu, Ag, Au, Pt, Pd, Rh, Hg, and Tl.

More preferably A is at least one element selected from the group comprising of Mg, Mn, Fe, Co, Ni, Cu, Ag, and Zn. This is because the use of the elements optimizes the ion radius in order to maintain the crystal structure while the ion mobility can sufficiently be secured. The coordination number is easily controlled to two.

Preferably A is at least one element selected from the group comprising of Cu and Ag. This is because the use of the elements can easily take the delafossite structure.

M is at least one element selected from the group comprising of Al, Ga, Sc, In, Y, La, Pr, Nd, Sm, Eu, Gd, Tb, Dy, Ho, Er, Tm, Tb, Lu, Ti, Ge, Sn, V, Cr, Mn, Fe, Co, Ni, Nb, Ta, Mo, W, Ru, Rh, and Pd.

More preferably M is at least one element selected from the group comprising of Y, Sc, V, Cr, Mn, Fe, Co, Ni, Al, and Ga. This is because the use of the elements easily controls the electron state in the crystal.

More preferably M is at least one element selected from the group comprising of Fe, Co, and Al. This is because the use of the elements can easily take the delafossite structure.

Further, for example, the first compound has the wolframite structure expressed by $A_xM_yX_4$ ($0.5 \leq x \leq 1.1$ and $0.7 \leq y \leq 1.1$). A and M are elements that are different from each other, and at least one of A and M is a transition element having the d orbital that is incompletely filled with electrons. X is at least one element selected from the group comprising of oxygen (O) and nitrogen (N).

A is at least one element selected from the group comprising of Na, K, Rb, Be, Mg, Ca, Sr, Ba, Al, Ga, Ti, V, Cr, Mn, Fe, Co, Ni, Cu, Zn, Si, P, S, Se, Ge, Ag, Au, Cd, Sn, Sb, Pt, Pd, Hg, Tl, Pb, and Bi.

Preferably A is at least one element selected from the group comprising of Ti, V, Mn, Fe, Co, and Ni. This is because the use of the elements optimizes the ion radius in order to maintain the crystal structure while the ion mobility can sufficiently be secured. The valence of the ion is easily controlled to divalence.

More preferably A is at least one element selected from the group comprising of Mn, Fe, Co, and Ni. This is because the use of the elements can easily generate the change in resistance.

M is at least one element selected from the group comprising of V, Nb, Ta, Cr, Mn, Mo, and W.

More preferably M is at least one element selected from the group comprising of Cr, Mo, and W. This is because the use of the elements can easily take the wolframite structure.

Further, for example, the first compound has the ilmenite structure expressed by $A_xM_yX_3$ ($0.5 \leq x \leq 1.1$ and $0.9 \leq y \leq 1$). A and M are elements that are different from each other, and at least one of A and M is a transition element having the d orbital that is incompletely filled with electrons. X is an element that includes at least one element selected from a group comprising of oxygen (O) and nitrogen (N).

A is at least one element selected from the group comprising of Na, K, Rb, Be, Mg, Ca, Sr, Ba, Al, Ga, Mn, Fe, Co, Ni, Cu, Zn, Si, P, S, Se, Ge, Ag, Au, Cd, Sn, Sb, Pt, Pd, Hg, Tl, Pb, and Bi.

Preferably A is at least one element selected from the group comprising of Mg, Mn, Fe, Co, Ni, and Zn. This is because the use of the elements optimizes the ion radius in order to maintain the crystal structure while the ion mobility can sufficiently be secured. The valence of the ion is easily controlled to divalence.

More preferably A is at least one element selected from the group comprising of Fe and Ni. This is because the use of the elements can easily take the ilmenite structure.

M is at least one element selected from the group comprising of Al, Ga, Ti, Ge, Sn, V, Cr, Mn, Fe, Co, Ni, Nb, Ta, Mo, W, Re, Ru, and Rh.

Preferably M is at least one element selected from the group comprising of Ti, Zr, Hf, V, Nb, Ta, Cr, Mn, Fe, Co, and Ni. This is because the use of the elements easily controls the electron state in the crystal.

Preferably M is at least one element selected from the group comprising of Ti, Zr, Hf, and V. This is because the use of the elements can easily take the ilmenite structure.

In the spinel structure expressed by $A_xM_yX_4$ ($0.1 \leq x \leq 2.2$ and $1.5 \leq y \leq 2$), the delafossite structure expressed by $A_xM_yX_2$ ($0.1 \leq x \leq 1.1$ and $0.9 \leq y \leq 1.1$), the wolframite structure expressed by $A_xM_yX_4$ ($0.5 \leq x \leq 1.1$ and $0.7 \leq y \leq 1.1$), and the ilmenite structure expressed by $A_xM_yX_3$ ($0.5 \leq x \leq 1.1$ and $0.9 \leq y \leq 1$), a lower limit of a molar ratio of x and y is set in order to maintain the crystal structure, and an upper limit of the molar ratio is set in order to control the electron state in the crystal.

It is necessary that the barrier layer have a function of preventing the reaction with the recording layer 13, a function of preventing the diffusion of the constituent element of the recording layer 13, and a function of electrically connecting the recording layer 13 and the adjacent layer. In order that the constituent element of the electrode layer does not diffuse into the recording layer 13, the electrode layer is made of a material other than Ag and Cu that has the ion conductivity.

This is because the material having the ion conductivity is removed. For example, Ag and Cu are well known as the material that does not have the ion conductivity. It is known that Ag and Cu diffuse into the recording layer 13 by the change in resistance when Ag and Cu are used as the electrode material. The diffusion phenomenon of Ag and Cu into the recording layer 13 can be confirmed by an analysis method such as energy dispersive X-ray fluorescence spectrometer (EDX) analysis.

The following materials are suitably used as the barrier layer.

MN

M is at least one element selected from the group comprising of Ti, Zr, Hf, V, Nb, Ta, Mo, and W. N is nitrogen.

$MO_x$

M is at least one element selected from the group comprising of Ti, V, Cr, Mn, Fe, Co, Ni, Cu, Zr, Nb, Mo, Ru, Rh, Pd, Ag, Hf, Ta, W, Re, Ir, Os, and Pt. A molar ratio x satisfies $1 \leq x \leq 4$.

$AMO_3$

A is at least one element selected from the group comprising of La, K, Ca, Sr, Ba, and Ln (Lanthanide).

M is at least one element selected from the group comprising of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

$A_2MO_4$

A is at least one element selected from the group comprising of K, Ca, Sr, Ba, and Ln (Lanthanide).

M is at least one element selected from the group comprising of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

(Peripheral Portion)

When the change in resistance is repeatedly generated, the A ion may diffuse onto the side of the insulating film material 16, and the material included in the recording layer 13 and the material included in the insulating film may inter-diffuse. In order to avoid the problem, the barrier layer that prevents the diffusion is provided between the first compound included in the recording layer and the insulating film. The peripheral portion 13B of the recording layer 13 is formed in order to prevent the diffusion, and preferably the peripheral portion 13B has the following features.

Because the A ion diffuses easily into the insulating film material when existing in the peripheral portion 13B of the recording layer 13, in the peripheral portion 13B of the recording layer 13, preferably a cation ratio of the A ion to the B ion becomes significantly smaller than that of the center portion 13A. In such cases, when the cation ratio becomes about ⅓ or less of that of the center portion 13A of the recording layer 13, preferably the diffusion of the A ion hardly occurs (see FIG. 2).

Figure 3:
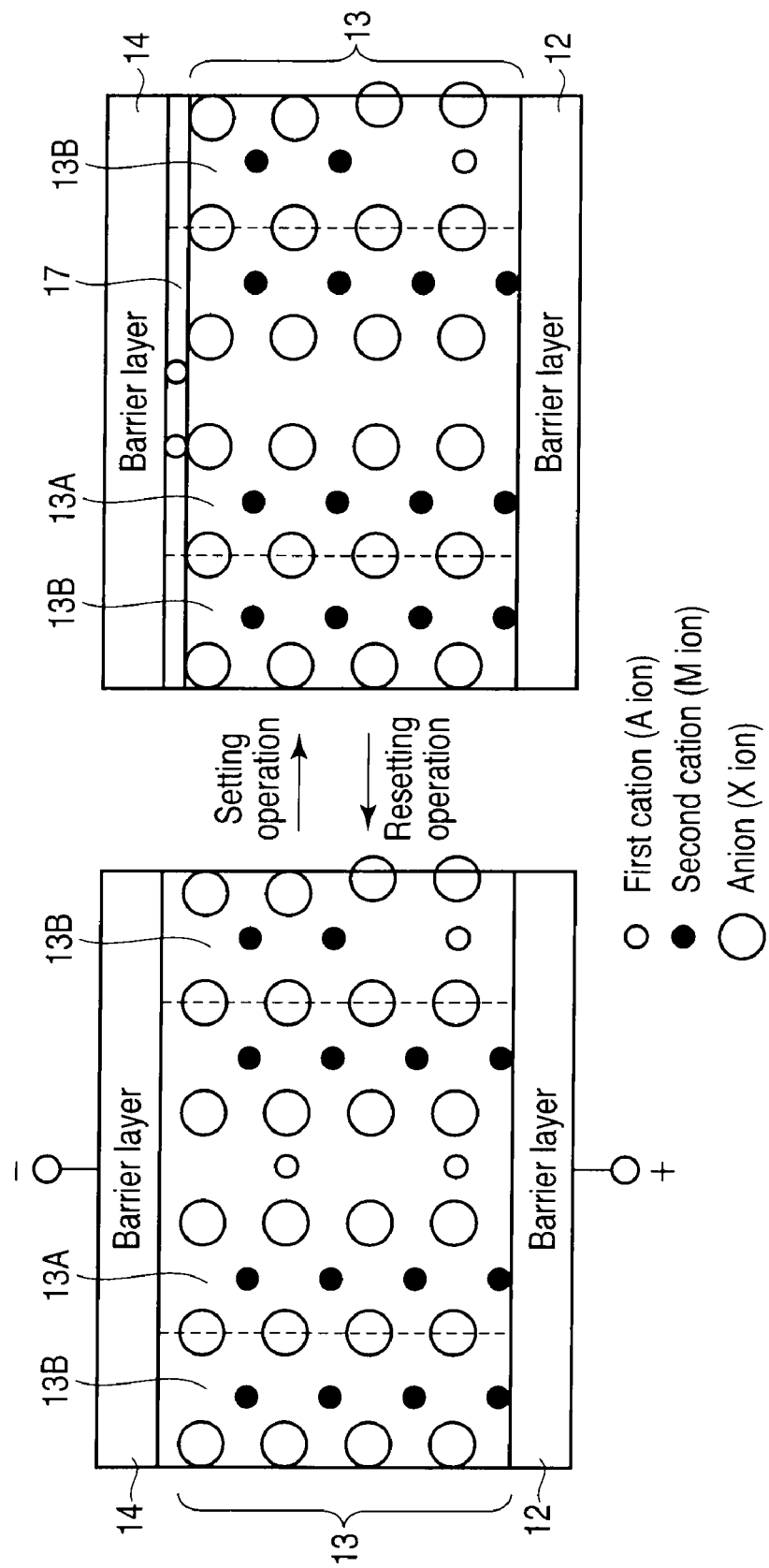

As illustrated in FIG. 3, the peripheral portion 13B of the recording layer 13 may have the crystal structure that is different from that of the center portion 13A of the recording layer 13. That is, the first compound having the crystal structure in which the diffusion path of the A ion is linearly formed is preferably used in the center portion 13A of the recording layer 13, and a third compound having the crystal structure in which the diffusion path is not linearly formed is preferably used in the peripheral portion 13B of the recording layer 13. In such cases, the mixed state of the third compound and the first compound that is identical to the center portion 13A of the recording layer 13 may be used in the peripheral portion 13B.

As described later, when processing is performed while the element is maintained at a high temperature, a mixing ratio of the A ion decreases in the peripheral portion 13B of the recording layer 13, and the crystalline state is hardly maintained only by the B ion and the 0 ion; therefore, occasionally the crystalline state changes to a usual crystal system possessed by oxide of the B ion. For example, a compound of $Cr_2O_4$ is left when a Zn ion that is the A ion diffuses, in the case where the $ZnCr_2O_4$ having the spinel structure is used as the first compound in the center portion 13A of the recording layer 13. When the compound of $Cr_2O_4$ is maintained at a temperature of about 500° C., the compound changes to $Cr_2O_3$ having a rhombohedral structure. At this point, when the conductivity in the peripheral portion 13B of the recording layer 13 is lower than that in the center portion 13A of the recording layer 13, the whole current passed through the memory cell portion decreases to enable the low power consumption.

Preferably cation volume density of the B ion increases in the peripheral portion 13B of the recording layer 13 compared to the center portion 13A. Because the valence of the B ion is larger than that of the A ion, the B ion receives repulsion of a Coulomb force and hardly diffuses. Accordingly, atomic inter-diffusion is hardly generated between the recording layer and the insulating film when the volume density of the B ion increases in the peripheral portion 13B.

In the peripheral portion 13B of the recording layer 13, an average distance between the B ions may be shortened. In such cases, the diffusion of the A ion hardly occurs.

As described above, when the A ion whose valence is divalence or less diffuses easily in the center portion 13A of the recording layer 13, preferably the number of A ions decreases in the peripheral portion 13B of the recording layer 13. When the B ion having at least trivalence hardly diffuses in the center portion 13A of the recording layer 13, preferably the number of B ions increases in the peripheral portion 13B of the recording layer 13.

Because the usual barrier layer ranges from about 1 nm to about 5 nm, a width of the peripheral portion 13B of the recording layer 13 also preferably ranges from about 1 nm to about 5 nm.

As described above, when the first compound and the third compound are mixed in the peripheral portion 13B of the recording layer 13, the amount of decrease or the amount of increase is hardly defined. Therefore, a specific region is determined in the peripheral portion 13B of the recording layer 13 (for example, a width of 3 nm from an end portion of the recording layer 13), the cation ratio and the cation volume density are calculated in the region, and the calculated cation ratio and cation volume density are compared to the values in a region except the peripheral portion 13B of the recording layer 13 (for example, the center portion 13A of the recording layer 13). Preferably the cation ratio in the peripheral portion 13B of the recording layer 13 is ⅓ or less of that in the center portion 13A of the recording layer 13. This is because, in consideration of the amount of change in diffusion coefficient of the A ion and the total amount of the A ion, the amount of diffusion of the A ion is maintained at a sufficiently low level when the cation ratio in the peripheral portion 13B of the recording layer 13 is ⅓ or less.

Figure 4:
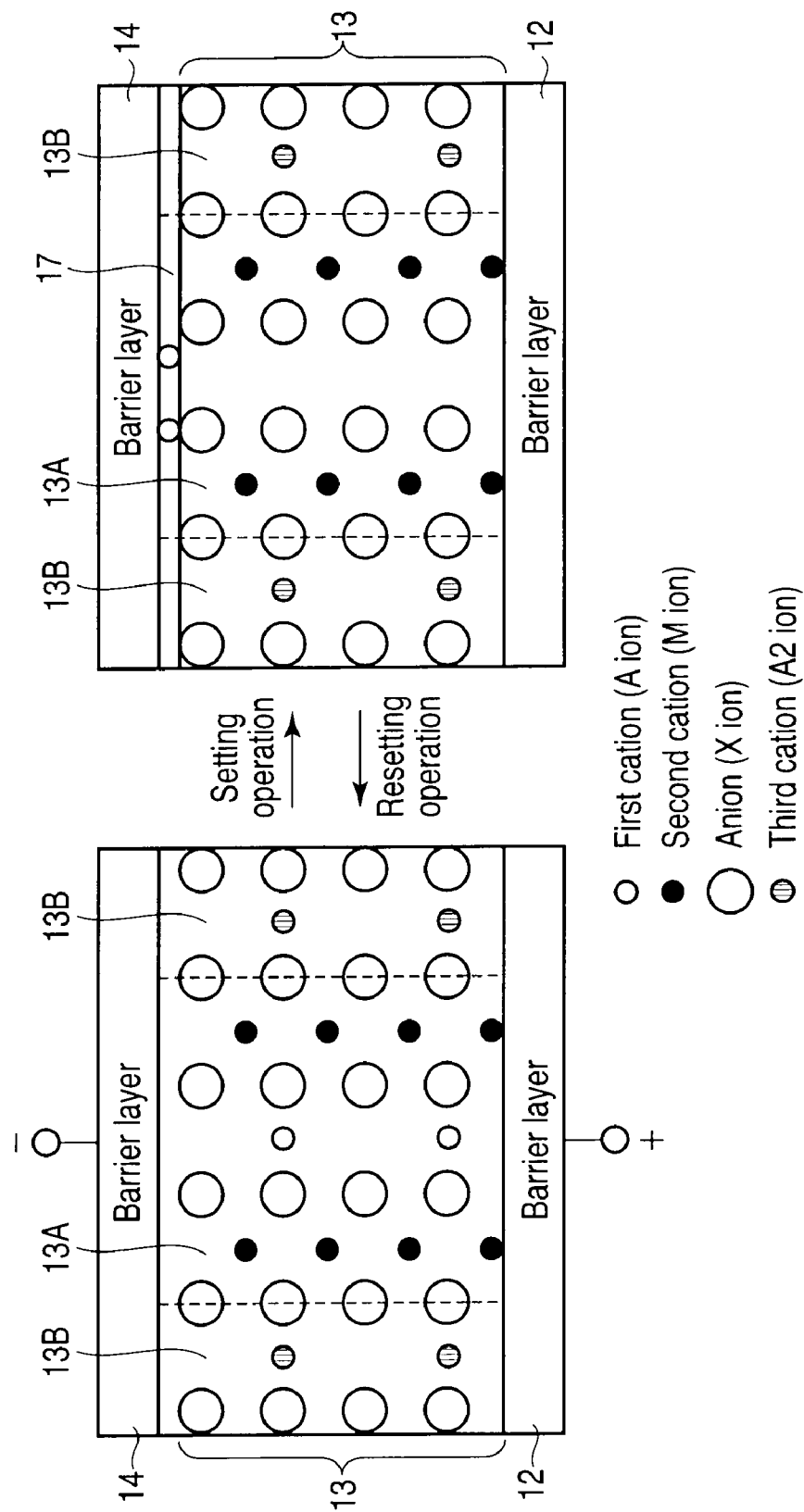

Alternatively, as illustrated in FIG. 4, the peripheral portion 13B of the recording layer 13 may include a third cation that is not included in the center portion 13A of the recording layer 13. In the A ion that diffuses easily in the center portion 13A of the recording layer 13, the ion radius is optimized and selected such that the diffusion easily occurs. On the contrary, when the ion having the large ion radius is included as an A2 ion in the peripheral portion 13B of the recording layer 13, the A ion left in the center portion 13A of the recording layer 13 can be prevented from diffusing into the insulating film material through the peripheral portion 13B of the recording layer 13. For example, Sr, Ba, Cd, Hg, and lanthanide (La) can be used as the A2 ion. At this point, the peripheral portion 13B of the recording layer 13 has the crystal structure identical to that of the center portion 13A of the recording layer 13, and when the A2 ion occupies the position, which is occupied by the A ion in the center portion 13A of the recording layer 13, in the peripheral portion 13B of the recording layer 13, the diffusion path of the A ion can be cut off.

The volume possibly changes in the peripheral portion 13B of the recording layer 13, when the crystal system changes in the peripheral portion 13B of the recording layer 13. Accordingly, when the recording layer 13 is subject to etching so as to be flush with wall surfaces of the first barrier layer and second barrier layer, occasionally the wall surface in the peripheral portion 13B of the recording layer 13 is not flush with the wall surfaces of the first barrier layer and second barrier layer. At this point, the end portion of the peripheral portion 13B of the recording layer 13 is set to an interface of the B ion included in the center portion 13A of the recording layer 13 and the insulating film material. Generally the interface can be determined with accuracy of about 1 nm.

(Method of Manufacturing Information Recording and Reproducing Device)

A method of manufacturing the cross-point information recording and reproducing device will specifically be described below with reference to FIGS. 8 to 11.

Figure 8:
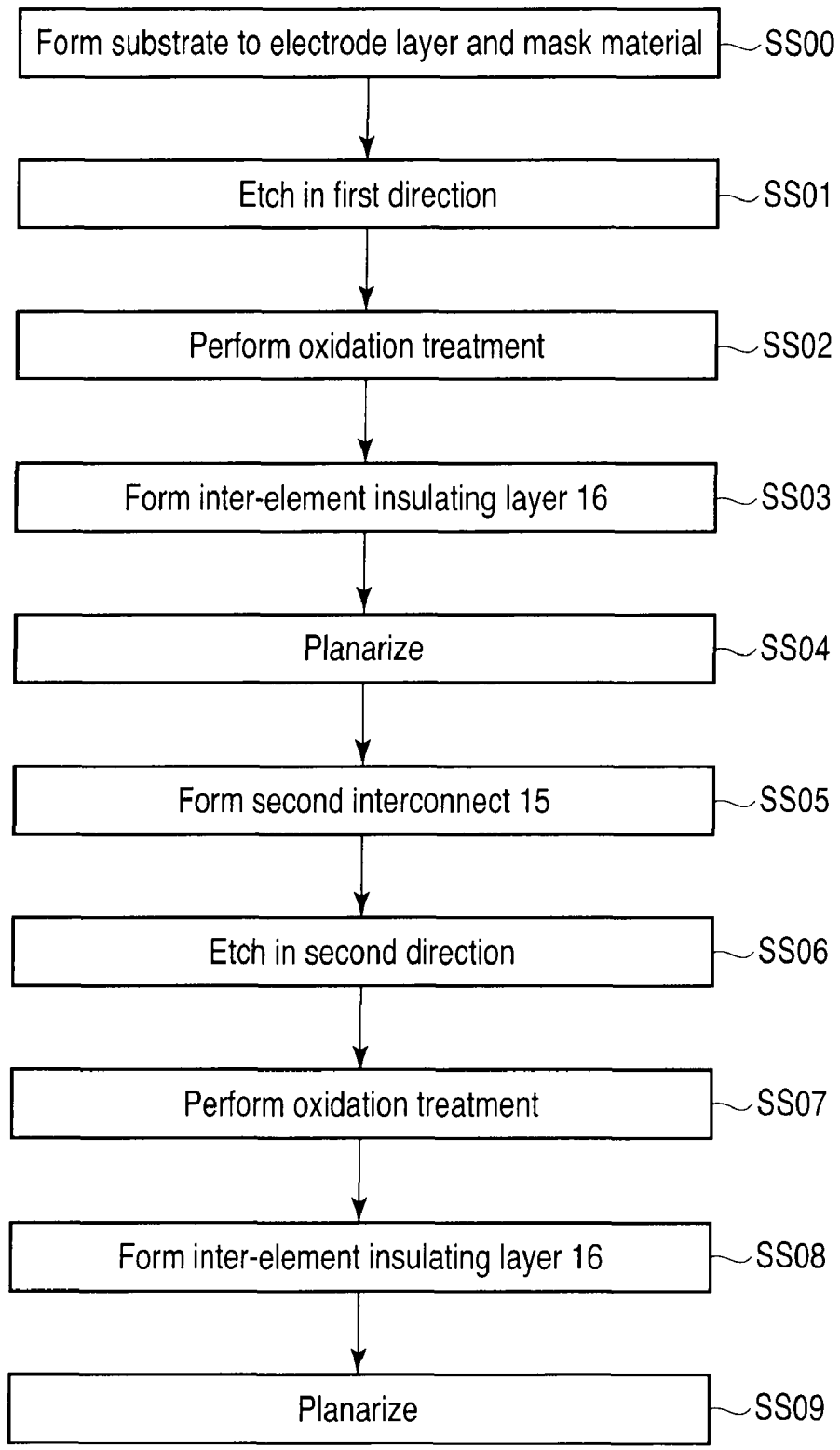
FIG. 8 is a view illustrating an example of a method of manufacturing the recording layer.

FIG. 8 is a flowchart illustrating an example 1 of the manufacturing method. FIGS. 9 and 10 are schematic process sectional views illustrating the example 1 of the manufacturing method. The manufacturing method will be described with reference to FIGS. 9 and 10.

As illustrated in FIG. 9A, for example, a Si substrate that is protected by a thermally-oxidized film is planarized by chemical mechanical polishing (CMP) to form a substrate 21.

The first interconnect 10 (bit line) made of a conductive material is deposited on the substrate 21. For example, a metal such as W, Ta, Al, and Cu or alloys thereof, metal silicide, nitride and carbide such as TiN and WC, and a highly-doped silicon layer can be used as the conductive material.

The rectification element 11 is deposited on the first interconnect 10. For example, the rectification element 11 is formed by the diode. At this point, a semiconductor layer made of Si, Ge, or GaAs is provided. The semiconductor layer is typically formed by a polycrystalline silicon layer. Alternatively, the semiconductor layer may be formed by an amorphous layer. Typically, after the highly-doped semiconductor layer (for example, a p-type semiconductor layer) is provided, a semiconductor layer (for example, an n-type semiconductor layer) in which a dopant (for example, n-type) is lightly doped having the reverse property of the highly-doped semiconductor layer is provided to form a diode layer.

The first barrier layer 12 is deposited on the rectification element 11. For example, the above-described materials can be used as the first barrier layer 12.

The recording layer 13 is deposited on the first barrier layer 12. Various materials can be used as the recording layer 13 as described above. In the embodiment, the recording layer 13 made of $ZnCr_2O_4$ having the spinel structure is deposited. As to the deposition method, for example, radio frequency magnetron sputtering is performed at temperatures of 300 to 600° C. in an atmosphere of 95% argon (Ar) and 5% oxygen ($O_2$) using a raw material (target) in which the composition is adjusted such that $ZnCr_2O_4$ is deposited, and $ZnCr_2O_4$ having a thickness of about 20 nm is formed.

When the first barrier layer 12 has a large crystal grain, and when a ratio of a lattice constant of the first barrier layer 12 and a lattice constant of the first compound 12A in the recording layer 13 is close to an integer number, the oriented first compound 12A having the large crystal grain is easily obtained. For example, when TiN oriented in (110) is used as the first barrier layer 12, because the ratio of the lattice constant to the spinel structure oriented in (110) substantially becomes an integer number, the spinel structure oriented in (110) is easily obtained as the recording layer 13.

Then the second barrier layer 14 is deposited on the recording layer 13. For example, the above-described materials can be used as the second barrier layer 14.

Then a mask material 18 is deposited on the second barrier layer 14. For example, noble metals such as Pt can be used as the mask material 18.

Then, as illustrated in FIG. 9B, etching is performed along a first direction (X-direction) with a pattern having predetermined dimensions by, for example, reactive ion etching (RIE). The etching is performed to a depth of an interface between the substrate 21 and the first interconnect 10. Thus, the first interconnect 10, the rectification element 11, the first barrier layer 12, the recording layer 13, and the second barrier layer 14 are patterned.

Then the processed body is subjected to an oxidation treatment. Therefore, the neighborhood of the side face of the recording layer 13 is oxidized. As illustrated in FIG. 9B, when viewed in the X-direction, the recording layer 13 has a center portion ($ZnCr_2O_4$) 13A of the recording layer 13 inside of a principal plane, and has a peripheral portion 13B in which the ratio of Zn to Cr decreases outside the principal plane. When an atmosphere is heated to a temperature of about 300° C. to perform the oxidation treatment, the ratio of the number of ions can easily change greatly in the outside region, and the region largely including $Cr_2O_3$ is formed.

Then, the insulating material is deposited in the space generated by the etching by, for example, chemical vapor deposition (CVD) to form the inter-element insulating layer 16.

As illustrated in FIG. 10A, the planarization is performed by, for example, CMP such that the second barrier layer 14 is exposed.

Then the second interconnect 15 (word line) made of the conductive material is evenly deposited on the processed body. For example, a metal such as W, Ta, Al, and Cu or alloys thereof, metal silicide, nitride and carbide such as TiN and WC, and a highly-doped silicon layer can be used as the conductive material.

The description will be made with reference to FIG. 10B. FIG. 10B is the sectional view taken on line A-A of FIG. 10A.

As illustrated in FIG. 10B, the etching is performed by, for example, RIE along the second direction (Y-direction) using a pattern having predetermined dimensions. The etching is performed to the depth of the interface between the first interconnect 10 and rectification element 11. Thus, the rectification element 11, the first barrier layer 12, the recording layer 13, the second barrier layer 14, and the second interconnect 15 are patterned.

Then the processed body is subjected to the oxidation treatment. Therefore, the neighborhood of the side face of the recording layer 13 is oxidized. As a result, as illustrated in FIG. 10C, when viewed in the Y-direction, the recording layer 13 has the center portion ($ZnCr_2O_4$) 13A of the recording layer 13 inside of the principal plane, and has a peripheral portion 13B in which the ratio of Zn to Cr decreases outside the principal plane. When the atmosphere is heated to the temperature of about 300° C. to perform the oxidation treatment, the ratio of the number of ions can easily change greatly in the outside region, and the region largely including $Cr_2O_3$ is formed.

Then, the insulating material is deposited in the space generated by the etching by, for example, chemical vapor deposition (CVD) to form the inter-element insulating layer 16. Therefore, the main part of the cross-point information recording and reproducing device of the first example is formed.

Figure 11:
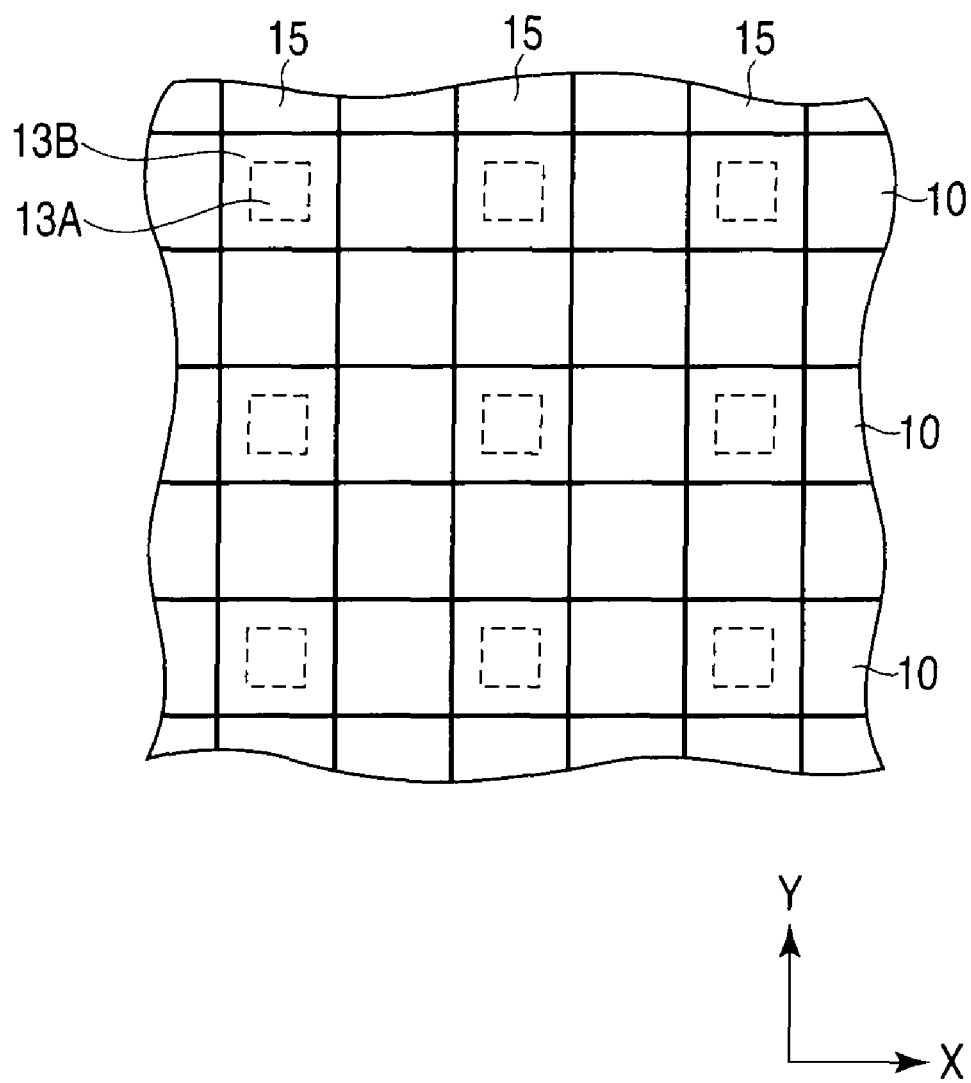
FIG. 11 is a view illustrating an example of the recording layer.

FIG. 11 is a plan view of the information recording and reproducing device produced by the example 1 of the manufacturing method. As illustrated in FIG. 11, in the information recording and reproducing device, a recording portion is provided in an intersection portion (cross point) of the first interconnect 10 and the second interconnect 15. This is the so-called cross-point cell array structure.

When viewed in the X-direction and the Y-direction, the recording layer 13 has the center portion 13A inside of the principal plane, and has the peripheral portion 13B in which the ratio of the A ion to the M ion relatively decreases outside the principal plane. Therefore, the above-described effect is obtained. That is, the change in resistance can stably be repeated.

1-2 Second Example

Cation Having Different Valence

As illustrated in FIG. 5, the diffusing first cation (A ion) and the second cation (M ion) constituting the base may be formed by the identical element. In such cases, it is necessary that the valence of the A ion be smaller than that of the M ion. This is the condition that the A ion diffuses easily compared with the diffusion of the M ion.

For example, the material having the spinel structure expressed by $A_xM_yO_4$ ($0.1 \leq x \leq 2.2$ and $1.5 \leq y \leq 2$) can be used as the first compound. When the A ion and the M ion are elements selected from the group comprising of Mn, Fe, and Co, the spinel in which the A ion is divalent while the M ion is trivalent can easily be formed. The average of the valence of the M ion ranges from trivalent to tetravalent when a defective site exists in the site where the A ion or the M ion is located.

For example, in the oxidation process after the etching in FIGS. 9 and 10, some of or all the Mn ions (A ions) in the divalent state can be oxidized to change to the $\alpha$-$Mn_2O_3$ structure. At this point, in the peripheral portion 13B of the recording layer 13, the ratio of the number of Mn ions in the divalent state to the number of Mn ions in at least the trivalent state decreases compared with the center portion 13A of the recording layer 13. In the surroundings of the recording layer 13, an average distance between the trivalent Mn ions decreases compared with the center portion 13A of the recording layer 13. Because the $\alpha$-$Mn_2O_3$ structure does not have the path through which the divalent Mn ion diffuses, the divalent Mn ion can be prevented from diffusing into the inter-layer insulating film even if the divalent Mn ion diffuses in the recording layer 13 in order to generate the change in resistance of the recording layer 13. Accordingly, the change in resistance can stably be repeated.

Because a usual barrier layer ranges from about 1 nm to about 5 nm, preferably the width of the peripheral portion 13B of the recording layer 13 also ranges from about 1 nm to about 5 nm.

1-3 Third Example

Stacked Type

Figure 6:
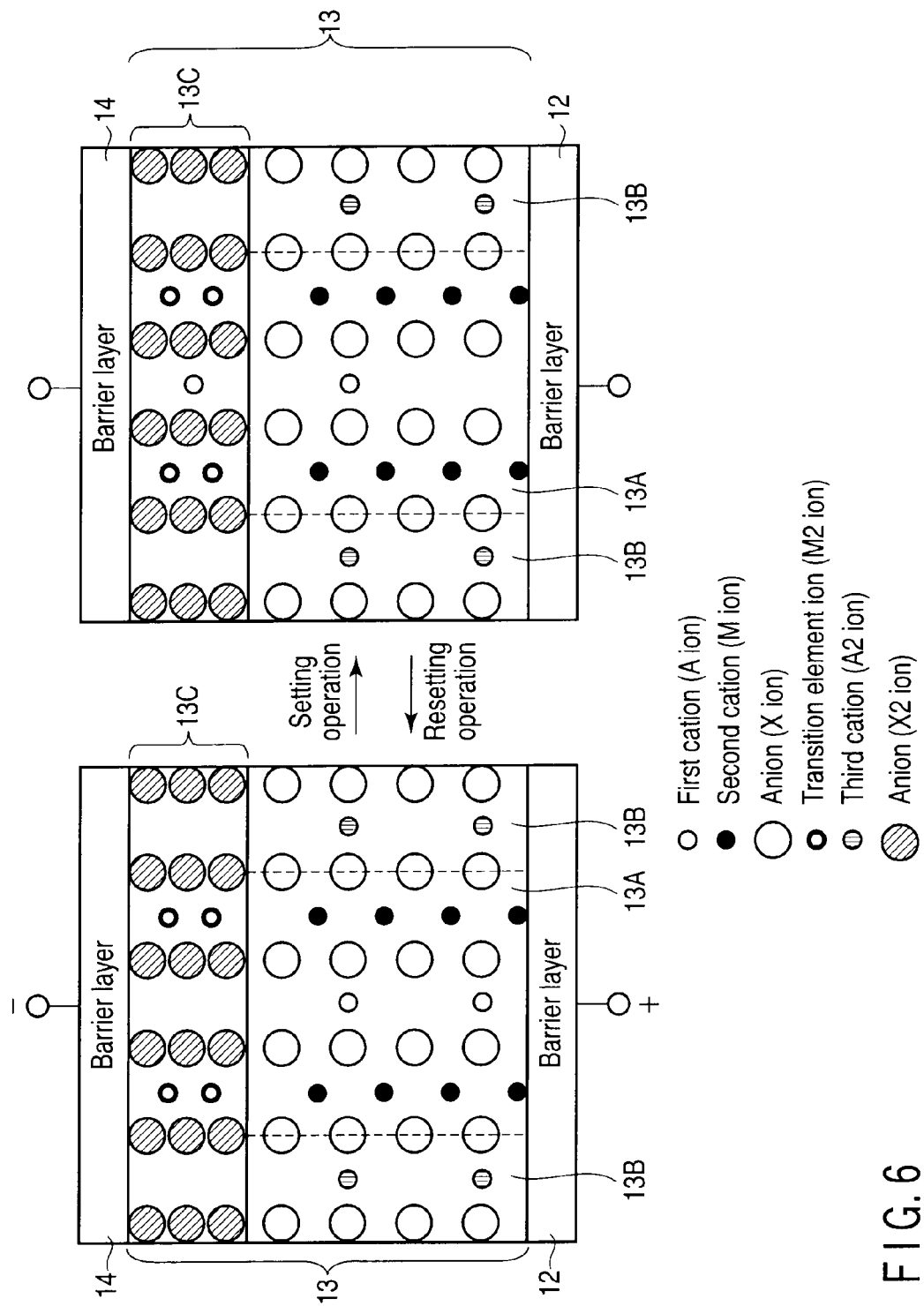

As illustrated in FIG. 6, preferably a layer 13C made of the second compound having a vacant site in which the first cation is accommodated is provided adjacent to the center and peripheral portions (the first compound layer) 13A, 13B, because the diffusing first cation element exists stably. The following materials can be exemplified as the second compound layer suitably used for this purpose. That is, the second compound layer has one of a hollandite structure, a ramsdellite structure, an anatase structure, a brookite structure, a pyrolusite structure, a $ReO_3$ structure, a $MoO_{1.5}PO_4$ structure, a $TiO_{0.5}PO_4$ structure, an $FePO_4$ structure, a $\beta MnO_2$ structure, a $\gamma MnO_2$ structure, a $\lambda MnO_2$ structure, and a spinel structure in which the vacant site is intentionally provided.

Figure 7:
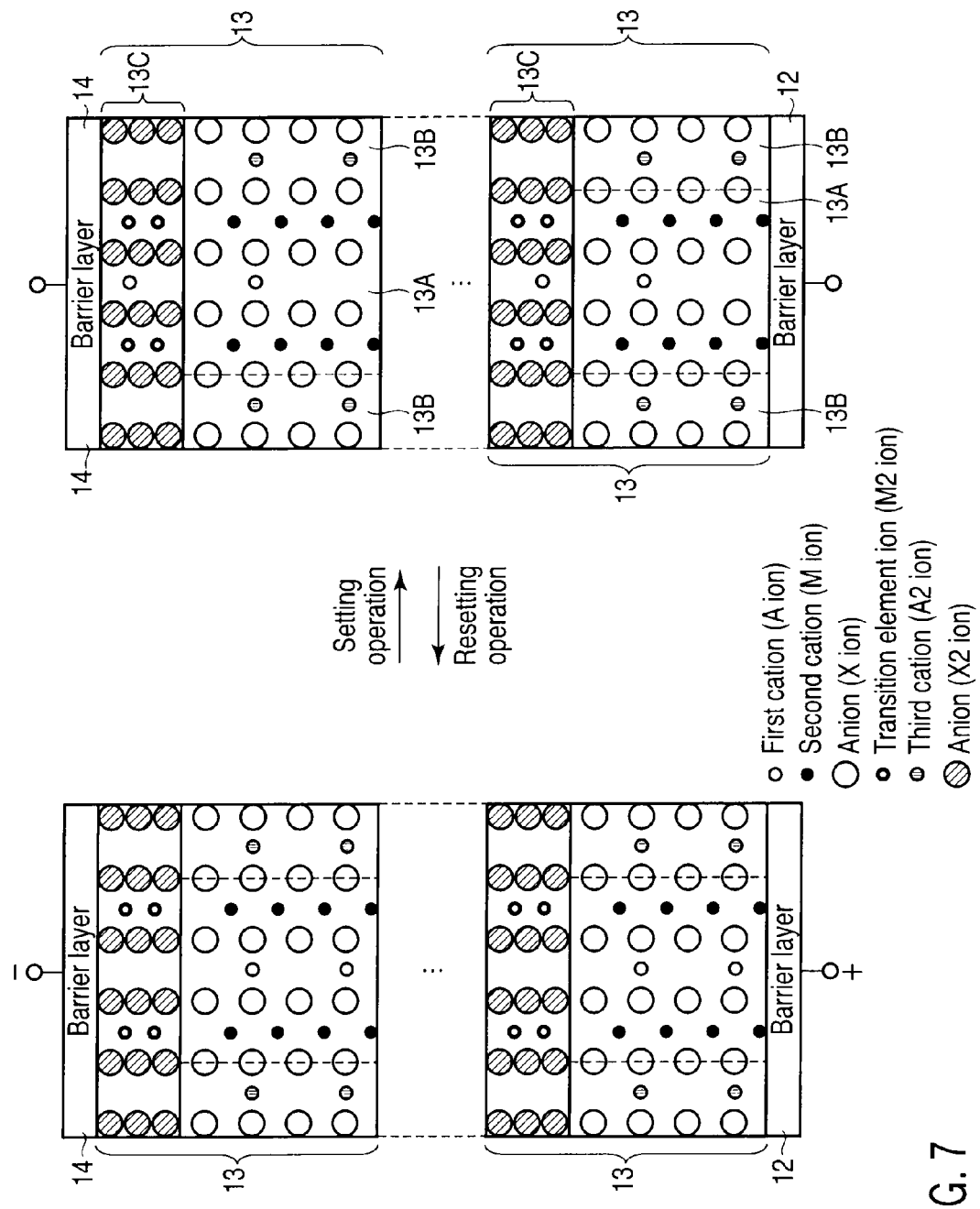

The first compound layer and the second compound layer may be stacked as illustrated in FIG. 7.

Thus, the diffusing A ion element stably exists when the recording layer 13C made of the second compound having the vacant site in which the A ion of the center portion 13A is accommodated is provided adjacent to the first compound. The combination of the materials is used to facilitate the ion acceptance between the center portion 13A and the recording layer 13C, which allows the power consumption necessary for the change in resistance to be reduced to enhance the thermal stability. In principle the recording density of a petabit-per-square-inch (Pbpsi) class can be realized by the use of the combination of the materials in the recording layers 13, 13C, and the low power consumption can also be achieved.

In FIG. 7, a small white circle in the center portion 13A indicates the A ion (for example, a diffusion ion), a small black circle in the center portion 13A indicates the M ion (for example, a base ion), and a large white circle in the recording layer 13A indicates the X ion (for example, an anion). In FIG. 7, a bold-line circle in the recording layer 13C indicates the M2 ion (for example, a transition element ion) and a hatched circle in the recording layer 13C indicates the X2 ion (for example, an anion).

As shown in FIG. 7, the memory cell may comprise at least two recording layers 13 including the center and peripheral portions 13A, 13B and the recording layer 13C.

In the memory cell, the potentials are provided to the barrier layers 12 and 14 to generate the potential gradient in the recording layer 13 such that the center portion 13A comprises the anode side while the recording layer 13C comprises the cathode side. As a result, some A ions in the center portion 13A including the first compound move in the crystal to invade in the recording layer 13C on the cathode side.

Because the vacant site of the A ion exists in the crystal of the recording layer 13C, the A ion that moves from the center portion 13A including the first compound is accommodated in the vacant site.

Therefore, the valences of some A ions or M2 ions decrease in the recording layer 13C, and the valences of some A ions or M ions decrease in the center portion 13A. Accordingly, it is necessary that at least one of the A ion and the M ion be the transition element having the d orbital that is incompletely filled with electrons such that the valence of one of the A ion and the M ion changes easily.

That is, in the initial state (resetting operation), assuming that the center portion 13A and the recording layer 13C are in the high-resistance state (insulator), some A ions in the center portion 13A move into the recording layer 13C to generate conduction carriers in the crystals of the center portion 13A and the recording layer 13C, and both the center portion 13A and the recording layer 13C have electrical conductivity.

Thus, because the current/voltage pulse is provided to the recording layer 13 to reduce the electrical resistance of the recording layer 13, the setting operation (recording) is realized.

At this point, electrons move simultaneously from the center portion 13A toward the recording layer 13C, and the Fermi level of the electron of the recording layer 13C is higher than that of the electron of the center portion 13A. Therefore, total energy of the recording layer 13 is raised.

Because the high energy state is continued even after the setting operation is completed, possibly the recording layer 13 returns naturally from the setting state (low-resistance state) to the resetting state (high-resistance state).

On the other hand, the use of the recording layer 13 of the embodiment avoids the anxiety. That is, the setting state can continuously be maintained.

This is because the so-called ion movement resistance works. As described above, for the information recording and reproducing device, preferably the coordination number of the A ion decreases (ideally to 2 or less) or the valence of the A ion decreases to divalent.

Because the oxidation agent is created on the anode side after the setting operation is completed, desirably the material (for example, a conductive oxide) that is hardly oxidized and does not have ion conductivity is used as the first barrier layer 12. The reason why the material is used and the preferable example are described above.

The resetting operation (erasing) is performed by promoting a phenomenon in which the recording layer 13 is heated to return the A ion accommodated in the vacant site of the recording layer 13C to the center portion 13A.

Specifically, when the Joule heat generated by providing the large current pulse to the recording layer 13 and the residual heat thereof are used, the recording layer 13 can easily be returned to the original high-resistance state (insulating material).

The large current pulse is provided to the recording layer 13 to increase the electrical resistance of the recording layer 13, thereby realizing the resetting operation (erasing). Alternatively, the resetting operation can also be performed by applying the electric field opposite to the setting operation.

In order to realize the low power consumption, it is important to use the structure in which the ion radius of the A ion is optimized to make the movement path such that the A ion can move in the crystal without generating the crystal destruction.

When the above-described material and crystal structure are used as the recording layer 13C, the conditions can be satisfied, and the material and crystal structure effectively realize the low power consumption.

In the compound having the structure like the recording portion described in the first and second examples, that is, the compound having one of the spinel structure expressed by $A_xM_yX_4$ ($0.1 \leq x \leq 2.2$ and $1.5 \leq y \leq 2$), the delafossite structure expressed by $A_xM_yX_2$ ($0.1 \leq x \leq 1.1$ and $0.9 \leq y \leq 1.1$), the wolframite structure expressed by $A_xM_yX_4$ ($0.5 \leq x \leq 1.1$ and $0.7 \leq y \leq 1.1$), and the ilmenite structure expressed by $A_xM_yX_3$ ($0.5 \leq x \leq 1.1$ and $0.9 \leq y \leq 1$), because the movement of the A ion is easily generated, the compound is suitably used as the first compound.

Particularly, when the center portion (the first compound) 13A is oriented such that the movement path is disposed in the direction in which the electrodes are connected, the A ion moves easily in the center portion 13A, which is preferable. When the lattice constant of the center portion 13A is matched with the lattice constant of the recording layer (the second compound) 13C, the orientation can easily be controlled to deposit the film even if the hardly-deposited material having the vacant site is used.

A preferable range of a film thickness of the second compound will be described below.

In order to obtain the effect of the accommodation of the A ion in the vacant site, preferably the second compound has the film thickness of 1 mm or more.

On the other hand, when the number of vacant sites of the second compound becomes larger than the number of A ions in the first compound, because the effect of the change in resistance of the second compound is reduced, preferably the number of vacant sites in the second compound is equal to or smaller than the number of A ions in the first compound that exists in the identical sectional area.

Because the density of the A ion in the first compound is substantially equal to the density of the vacant site in the second compound, preferably the film thickness of the second compound is equal to or smaller than that of the first compound.

In order to further promote the resetting operation, a heater layer (a material having resistivity of about $10^{-5}$ Ωcm or more) may be provided on the cathode side.

In the case where the number of vacant sites in the peripheral portion of the second compound layer is smaller than that in the center portion of the second compound layer, the number of A ions that diffuse from the side face of the second compound layer to the inter-layer insulating film can decrease when the change in resistance is repeated to move the A ions.

3. Driving Method

FIG. 12 illustrates a cross-point semiconductor memory according to an example of the invention.

Bit lines $BL_{i-1}$, $BL_i$, and $BL_{i+1}$ extend in the X-direction, and word lines $WL_{j-1}$, $WL_j$, and $WL_{j+1}$ extend in the Y-direction.

One end of each of bit lines $BL_{j-1}$, $BL_j$, and $BL_{j+1}$ is connected to a bit line driver and decoder 31 through a MOS transistor RSW that is a selection switch. One end of each of word lines $WL_{i-1}$, $WL_i$, and $WL_{i+1}$ is connected to a word line driver and decoder and read circuit 32 through a MOS transistor CSW that is a selection switch.

Selection signals $R_{i-1}$, $R_i$, and $R_{i+1}$ are input to gates of the MOS transistors RSW to select one bit line (row), and selection signals $C_{i-1}$, $C_i$, and $C_{i+1}$ are input to gates of the MOS transistors CSW to select one word line (column).

A memory cell 33 is disposed in an intersection portion of each of bit lines $BL_{i-1}$, $BL_i$, and $BL_{i+1}$ and each of word lines $WL_{j-1}$, $WL_j$, and $WL_{j+1}$. This is a so-called cross-point cell array structure.

A diode 34 is added to the memory cell 33 in order to prevent a sneak current during the recording/reproduction.

Figure 13:
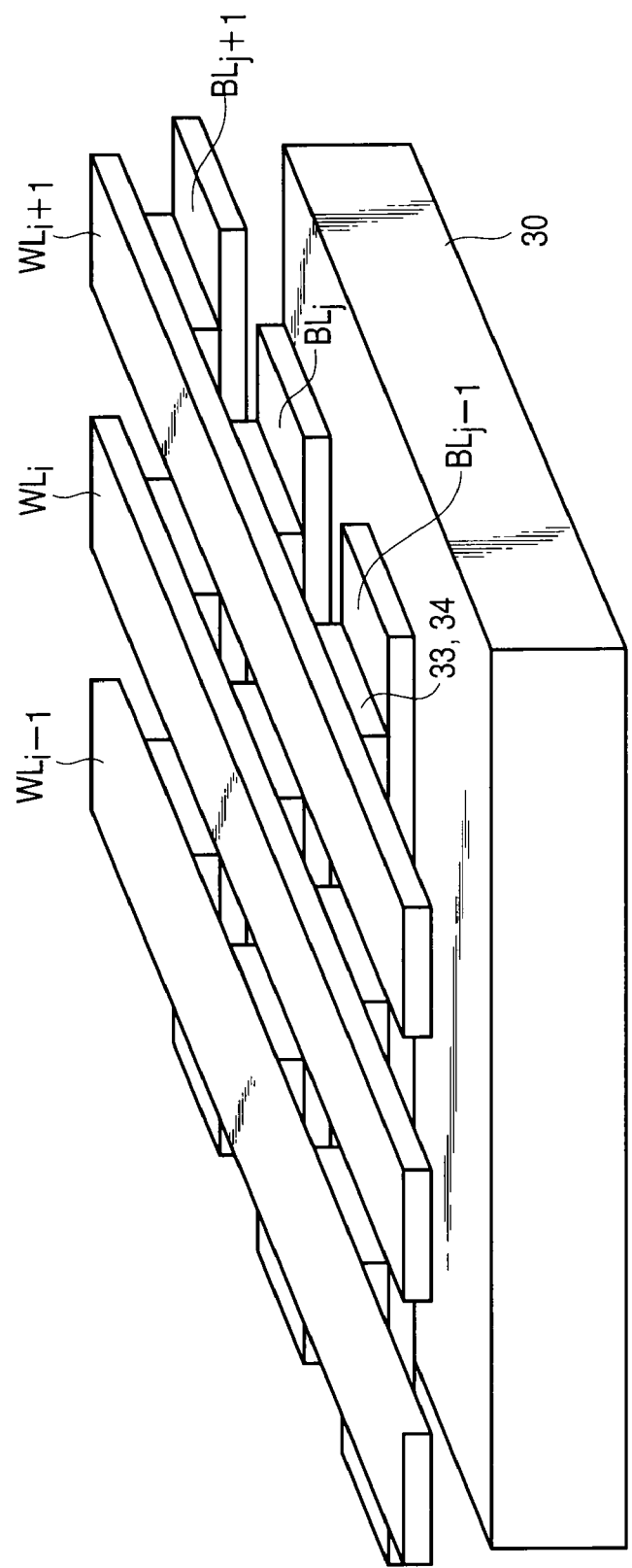
FIGS. 13 to 15 are views, each illustrating an example of a memory cell array structure.

FIG. 13 illustrates a structure of a memory cell array portion of the semiconductor memory of FIG. 12.

Bit lines $BL_{i-1}$, $BL_i$, and $BL_{i+1}$ and word lines $WL_{j-1}$, $WL_j$, and $WL_{j+1}$ are disposed on the semiconductor chip 30, and the memory cell 33 and the diode 34 are disposed in the intersection portion of the interconnects.

Figure 14:
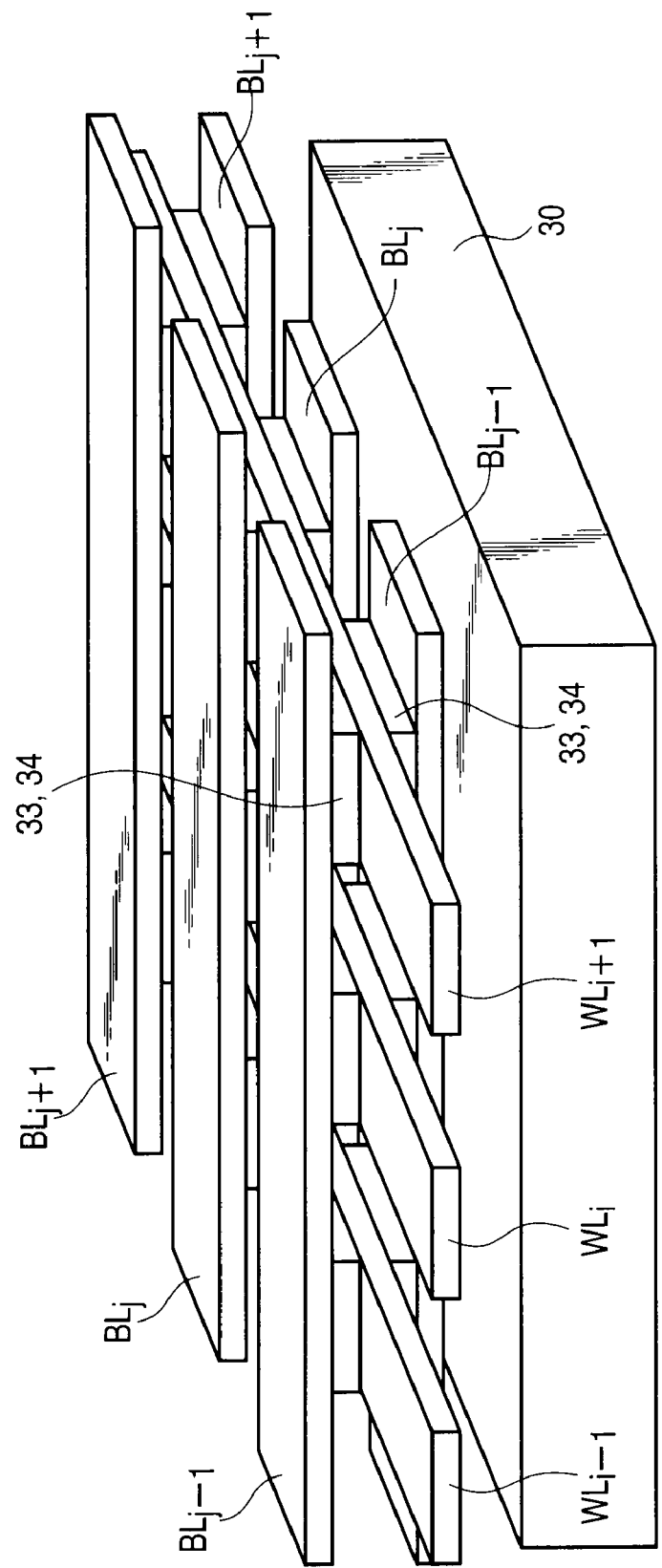
Figure 15:
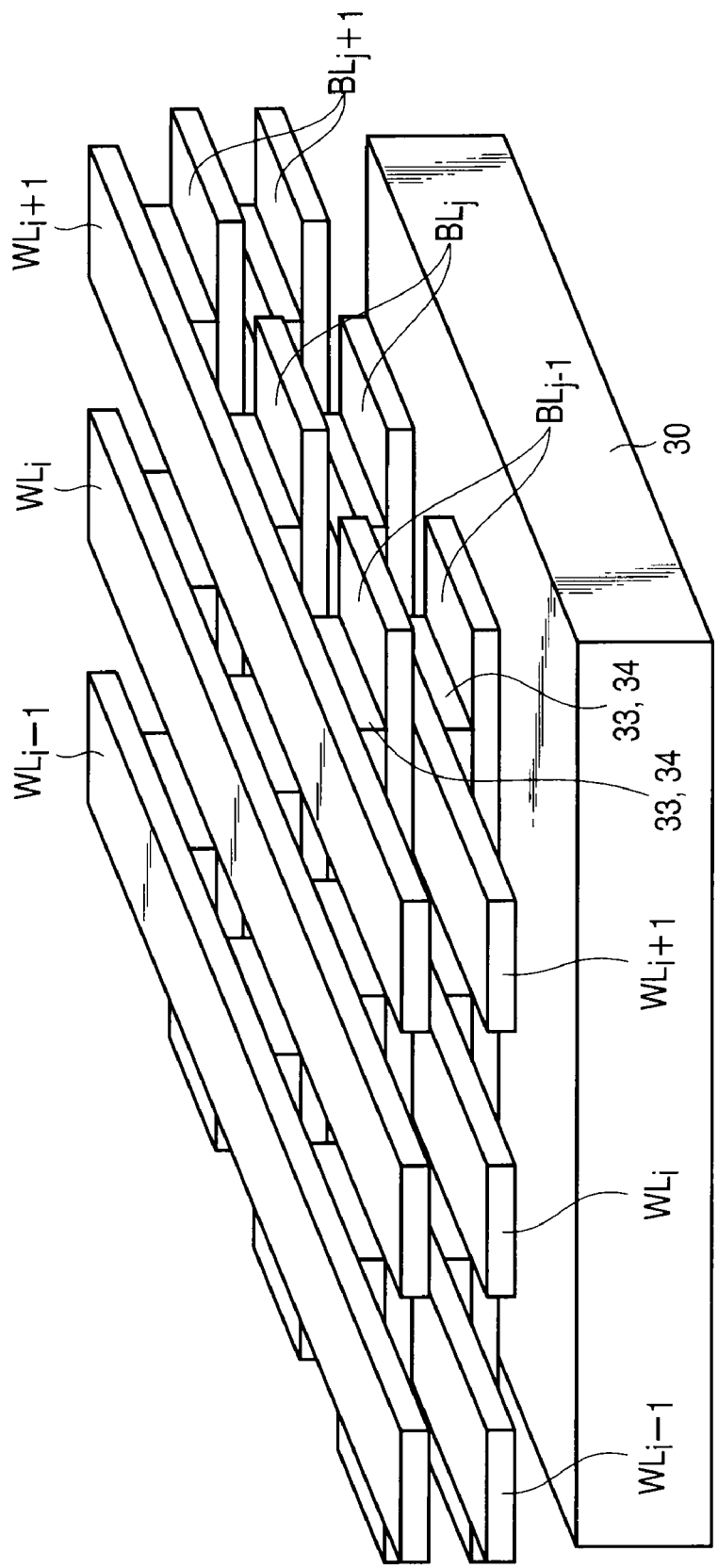

The most distinctive feature of the cross-point cell array structure is that high integration is advantageously achieved because of elimination of the necessity to individually connect the MOS transistor to the memory cell 33. For example, as illustrated in FIGS. 14 and 15, the memory cells 33 can be stacked to form a three-dimensional structure of the memory cell array.

For example, as illustrated in FIG. 1, the memory cell 33 is formed by the stacked structure including the first barrier layer 12, the recording layer 13, and the second barrier layer 14. The one memory cell 33 stores one bit data therein. In the embodiment, the diode 34 is used as the rectification element 11.

The recording/reproducing operation will be described below.

In the information recording (setting operation), the potential gradient is generated in the selected memory cell 33 to pass the current pulse through the memory cell 33. Therefore, for example, the potential at bit line $BL_i$ is set relatively lower than the potential at word line $WL_j$. The negative potential only needs to be provided to word line $WL_j$ when bit line $BL_i$ is set to the fixed potential (for example, ground potential).

At this point, the diffusion of the first cation is generated in the recording layer 13, and the anion becomes excessive in the recording layer 13, whereby the valence of the transition element ion increases in the recording layer 13. Therefore, because the recording layer 13 has the conductivity, the recording (setting operation) is ended.

Preferably all the unselected bit lines $BL_{i-1}$ and $BL_{i+1}$ and all the unselected word lines $WL_{j-1}$ and $WL_{j+1}$ are biased to an identical potential during the information recording.

Preferably all bit lines $BL_{i-1}$, $BL_i$, and $BL_{i+1}$ and all word lines $WL_{j-1}$, $WL_j$, and $WL_{j+1}$ are pre-charged during standby before the information recording.

The voltage pulse necessary for the information recording may be generated by setting the potential at bit line $BL_i$ relatively higher than the potential at word line $WL_j$.

The voltage pulse is passed through the memory cell 33 to detect the resistance of the memory cell 33, thereby performing the information reproduction. However, it is necessary to set the voltage pulse to a minute amplitude to an extent that the phase change does not occur in the material of the memory cell 33.

For example, a read current generated by a read circuit is passed from word line $WL_j$ to the memory cell 33, and the resistance of the memory cell 33 is measured by the read circuit.

In the erasing (resetting) operation, it is necessary that the memory cell 33 be subjected to the Joule heating by the large current pulse to promote the redox reaction of the recording layer 13. That is, the recording layer 13 returns to the insulator by the residual heat after the large current pulse is cut off (resetting operation).

In such a semiconductor memory, the higher recording density and the lower power consumption can be realized compared with the current hard disk or flash memory.

4. Effect of the Invention

According to the example of the invention, the information recording and reproducing device having the high repetitive stability can be provided, because the cation can be prevented from diffusing from the surroundings of the recording layer.

The example of the invention has a huge industrial merit as the next-generation memory that has the recording density larger than that of the current nonvolatile memory.

The invention is not limited to the embodiment, but various modifications of each constituent can be made without departing from the scope of the invention. Various inventions can be made by an appropriate combination of the plural constituents disclosed in the embodiments. For example, some constituents may be eliminated from all the constituents disclosed in the embodiments, or constituents of different embodiments may appropriately be combined.

What is claimed is:

1. An information recording and reproducing device comprising:
a first layer;
a second layer; and
a recording layer between the first and second layers, which is capable of a transition between a first state of a low resistance and a second state of a high resistance by flowing a current between the first and second layers,
wherein the first layer, the recording layer and the second layer are arranged in a first direction, the recording layer has a peripheral portion which is provided at an end portion in a second direction perpendicular to the first direction, the peripheral portion of the recording layer has a composition different from that of a center portion of the recording layer, the center portion is surrounded by the peripheral portion,
the center portion includes two kinds of cation elements, and
the center portion is different from the peripheral portion in a ratio of the two kinds of cation elements.

2. The device of claim 1, wherein the ratio in the peripheral portion is ⅓ or less of the ratio in the center portion with respect to one of the two kinds of cation elements.

3. The device of claim 1, wherein a volume density of one of the two kinds of cation elements in the peripheral portion is higher than that in the center portion.

4. The device of claim 1, wherein an average distance between cations of one of the two kinds of cation elements in the peripheral portion is lower than that in the center portion.

5. The device of claim 1, wherein the center portion includes a cation element with divalence and a cation element with trivalence or more.

6. The device of claim 5, wherein the cation element with divalence in the peripheral portion is less than that in the center portion.

7. An information recording and reproducing device comprising:
a first layer;
a second layer; and
a recording layer between the first and second layers, which is capable of a transition between a first state of a low resistance and a second state of a high resistance by flowing a current between the first and second layers,
wherein the first layer, the recording layer and the second layer are arranged in a first direction, the recording layer has a peripheral portion which is provided at an end portion in a second direction perpendicular to the first direction, the peripheral portion of the recording layer has a composition different from that of a center portion of the recording layer, the center portion is surrounded by the peripheral portion,
the center portion includes cation elements having two kinds of valences, and
the center portion is different from the peripheral portion in a ratio of the number of cation element with divalence to the number of cation element with trivalence or more.

8. The device of claim 7, wherein the ratio in the peripheral portion is less of the ratio in the center portion.

9. The device of claim 8, wherein the ratio in the peripheral portion is ⅓ or less of the ratio in the center portion.

10. The device of claim 1, wherein one of the cation elements is a transition element with a d orbital that is incompletely filled with electrons, and the first layer includes a first compound in which a shortest distance between the cation elements is 0.32 nm or less.

11. The device of claim 7, wherein one of the cation elements is a transition element with a d orbital that is incompletely filled with electrons, and the first layer includes a first compound in which a shortest distance between the cation elements is 0.32 nm or less.

12. The device of claim 10, wherein the first compound has one of a spinel structure expressed by $A_xM_yX_4$ ($0.1 \leq x \leq 2.2$ and $1.5 \leq y \leq 2$), a delafossite structure expressed by $A_xM_yX_2$ ($0.1 \leq x \leq 1.1$ and $0.9 \leq y \leq 1.1$), a wolframite structure expressed by $A_xM_yX_4$ ($0.5 \leq x \leq 1.1$ and $0.7 \leq y \leq 1.1$), and an ilmenite structure expressed by $A_xM_yX_3$ ($0.5 \leq x \leq 1.1$ and $0.9 \leq y \leq 1$).

13. The device of claim 11, wherein the first compound has a spinel structure expressed by $A_xM_yX_4$ ($0.1 \leq x \leq 2.2$ and $1.5 \leq y \leq 2$).

14. The device of claim 12, wherein the first compound has the spinel structure, and one of the cation elements is Zn, Cd or Hg.

15. The device of claim 12, wherein the first compound has the spinel structure, and one of the cation elements is Cr or Mn.

16. The device of claim 13, wherein the first compound has the spinel structure, and A and M are at least one element selected from Fe, Co, and Mn.

17. The device of claim 1, wherein a width of the peripheral portion ranges from 1 nm to 5 nm.

18. The device of claim 7, wherein a width of the peripheral portion ranges from 1 nm to 5 nm.

19. The device of claim 12, wherein the peripheral portion of the recording layer includes an element A2 except A, M, and X.

20. The device of claim 13, wherein the peripheral portion of the recording layer includes an element A2 except A, M, and X.

21. The device of claim 19, wherein the peripheral portion of the recording layer has a crystal structure similar to that of the center portion, and the element A2 is replaced with A in the center portion.

22. The device of claim 20, wherein the peripheral portion of the recording layer has a crystal structure similar to that of the center portion, and the element A2 is replaced with A in the center portion.

* * * * *